(12) United States Patent
Boss et al.

(10) Patent No.: US 7,868,634 B2
(45) Date of Patent: Jan. 11, 2011

(54) PROBE OR MEASURING HEAD WITH ILLUMINATION OF THE CONTACT REGION

(75) Inventors: Hermann Boss, Holzkirchen (DE); Johannes Steffens, Rosenheim (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 186 days.

(21) Appl. No.: 11/913,637

(22) PCT Filed: Mar. 22, 2006

(86) PCT No.: PCT/EP2006/002641
§ 371 (c)(1), (2), (4) Date: Jun. 13, 2008

(87) PCT Pub. No.: WO2006/122600
PCT Pub. Date: Nov. 23, 2006

(65) Prior Publication Data
US 2009/0021276 A1 Jan. 22, 2009

(30) Foreign Application Priority Data
May 20, 2005 (DE) .................. 10 2005 023 425

(51) Int. Cl.
*G01R 31/02* (2006.01)
(52) U.S. Cl. ............................................. 324/761
(58) Field of Classification Search .................. None
See application file for complete search history.

(56) References Cited
U.S. PATENT DOCUMENTS

| | | | |
|---|---|---|---|
| 1,639,889 A * | 8/1927 | Humm | 324/72.5 |
| 3,786,340 A * | 1/1974 | Otten et al. | 324/301 |
| 3,910,701 A * | 10/1975 | Henderson et al. | 250/226 |
| 4,028,621 A | 6/1977 | Bloxam | |
| 4,126,380 A | 11/1978 | Borm | |
| 4,356,442 A | 10/1982 | Beha | |
| 5,175,772 A * | 12/1992 | Kahn et al. | 382/141 |
| 5,672,964 A | 9/1997 | Vinci | |
| 6,377,054 B1 * | 4/2002 | Beha | 324/510 |
| 2009/0206859 A1 * | 8/2009 | Swaim et al. | 324/756 |

FOREIGN PATENT DOCUMENTS

| | | |
|---|---|---|
| EP | 0 570 840 | 11/1993 |
| EP | 0 974 844 | 1/2000 |
| EP | 1 203 962 | 5/2002 |
| JP | 05196637 | 8/1993 |
| JP | 09026435 | 1/1997 |

OTHER PUBLICATIONS

International Search Report for PCT/EP2006/002641 dated May 24, 2006.

* cited by examiner

*Primary Examiner*—Jermele M Hollington
(74) *Attorney, Agent, or Firm*—Marshall, Gerstein & Borun LLP

(57) ABSTRACT

A probe or measuring head for measuring an electrical signal of an electrical contact has an electrically conducting feeler (1) which protrudes out of a housing (3) and has, at its end, a contact region (4) which comes into touching contact with the electrical contact. The contact region (4) of the feeler (1) and the measurement environment surrounding the contact region (4) of the feeler (1) is illuminated by the light beams from a light source ($10_1, 10_2, \ldots, 10_n, 10_o$) connected to the probe or measuring head.

12 Claims, 4 Drawing Sheets

PROBE OR MEASURING HEAD WITH ILLUMINATION OF THE CONTACT REGION

BACKGROUND OF THE INVENTION

1. Field of the Invention

The invention relates to a probe or measuring head with illumination of the contact region of the probe or measuring head and of the surrounding test environment. This application is a 371 of PCT/EP06/02641 filed on Mar. 22, 2006.

2. Related Technology

Probes or measuring heads are important in the context of the electrical measurement of analog or digital circuits. For example, EP 0 570 840 B1 describes and presents a probe or measuring head of this kind. In essence, such probes or measuring heads consist of an electrically-conductive probe pin guided axially within a non-conductive housing, which is designed as a handle to allow convenient handling of the probe or measuring head. The end of the electrically-conductive probe pin disposed within the housing is linked via a connecting line to a measurement channel of a measuring instrument or system, while the end of the electrically-conductive pin projecting from the housing provides a contact region, preferably a tip, which is disposed in contact with the electrical contact to be tested during the measurement. Measuring heads of this kind are used as active or passive probes for oscilloscopes and also for spectrum analysers and network analysers.

The probes or measuring heads, which have subsequently appeared on the market, provide a plurality of mechanical, functional features, which allow the establishment of a safe and convenient contact between the probe or measuring head and the electrical contact to be tested even in the case of small-scale circuit structures. However, in view of an increasing miniaturisation of circuit structures, contacting still remains problematic in the face of inaccessible circuit elements or poor lighting conditions, in spite of the technical maturity of such probes or measuring heads.

GENERAL DESCRIPTION OF THE INVENTION

The invention therefore provides an improved probe or measuring head that provides safe and convenient contacting between the electrical contact to be tested and the probe tip of the probe or measuring head is guaranteed even with a high level of miniaturisation of the circuit structures, inaccessible circuit elements and poor lighting conditions.

Accordingly, the invention provides a probe or measuring head for measuring an electrical signal of an electrical contact comprising an electrically-conductive probe pin projecting from a housing with a contact region at the end of the probe pin, which can be brought into contact with the electrical contact, characterised in that the contact region of the probe pin and the test environment surrounding the contact region of the probe pin are illuminated by a light source connected to the probe or measuring head.

The probe tip or measuring tip of the probe or measuring head and of the surrounding test environment are illuminated in order to improve visibility within the region of the probe or measuring tip of the probe or measuring head and of the electrical contact to be tested either in poor lighting conditions or in the case of inaccessible components. The invention provides a light source, which is positioned either in the proximity of the probe tip or within the probe or measuring or head or within a measuring instrument or system connected to the probe or measuring head or within an additional module connected to the probe or measuring head.

If the light source is integrated within the probe or measuring head, within a measuring instrument or system connected to the probe or measuring head or within an additional module connected to the probe or measuring head, the light rays of a light source positioned in this manner are preferably guided via optical waveguides, preferably synthetic-material optical waveguides, towards the probe tip or measuring tip of the probe or measuring head. If the light source is positioned within the housing of the probe or measuring head, the insulating layer, which encloses the electrically-conductive probe-pin up to the probe tip or measuring tip, can be used for this purpose.

If the light source is positioned in the housing of the probe or measuring head, the light rays from the light source can be guided through recesses in the housing of the probe or measuring head towards the probe tip or measuring tip of the probe or measuring head instead of using the insulating layer as the optical waveguide In order to provide a high intensity of light in the region of the probe or measuring tip, a targeted bundling of the light rays is preferably achieved by designing the insulating layer and/or the recesses in the housing of the probe or measuring head in a targeted manner and by positioning the recesses in the housing of the probe or measuring head appropriately.

By contrast, if diffuse lighting is required in the region of the probe or measuring tip, a light-scattering layer is preferably attached either to the end of the insulating layer facing the probe tip or measuring tip or inside the recesses in the housing of the probe or measuring head.

The measuring channel of the measuring instrument or system used by the probe or measuring head preferably indicated by using several differently-colored light-emitting diodes as the light source and through an appropriate control of the light-emitting diodes. Alternatively, the colour of the light rays can be used to indicate the level of the electrical potential of the electrical contact measured by the probe or measuring head.

Finally, a magnification of the probe tip or measuring tip and of the test environment to be measured with the probe or measuring tip can be realized by providing an optical lens, which is guided in an adjustable manner on the probe or measuring head. Similarly, a camera, miniaturized, for example, using micro-systems technology, can record the contacting process between the probe tip or measuring tip and the electrical contact and can identify any errors occurring in an automated testing of several electrical contacts via subsequent image processing.

BRIEF DESCRIPTION OF THE DRAWINGS

The preferred exemplary embodiments of the probe or measuring head according to the invention with illumination of the contact region of the probe or measuring head are explained below with reference to the drawings. The drawings are as follows.

DETAILED DESCRIPTION

On the basis of FIGS. 1 to 7, the following section presents the preferred embodiments of the probe or measuring head according to the invention with illumination of the contact region of the probe or measuring head and the surrounding test environment 24. The description is limited to a schematic presentation of features substantial to the invention.

Figure 1:
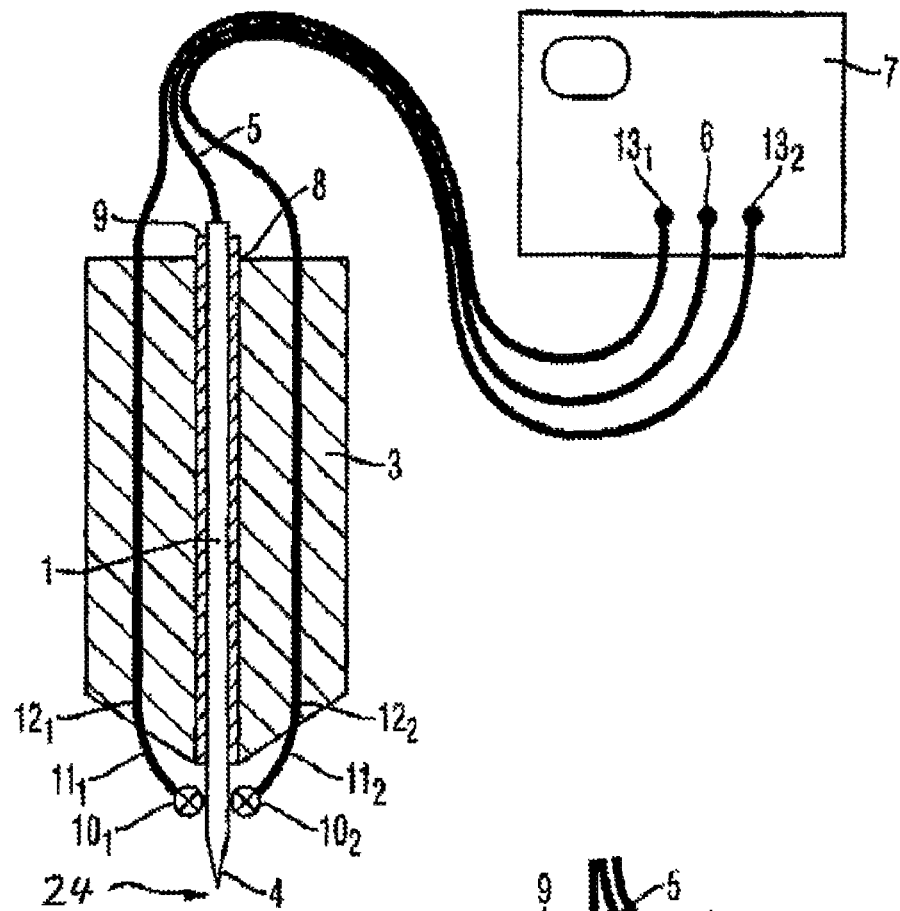
FIG. 1 shows a cross-sectional view of a first embodiment of the probe or measuring head according to the invention with illumination of the contact region of the probe or measuring head and the surrounding test environment.

The first embodiment of the probe or measuring head according to the invention shown in FIG. 1 comprises an electrically-conductive probe pin 1, which is guided axially in a central, internal borehole 2 of a substantially-cylindrical housing 3.

One end of the probe pin 1 is guided outwards from the housing 3 and, at the end projecting from the housing 3, provides a contact region 4, with which the probe or measuring head comes into contact with the electrical contact of the electrical circuit under test. The contact region 4 is preferably designed as a probe tip or measuring tip, so that it can measure safely and correctly even miniaturized electrical circuits with electrical contacts of small geometric extension. Instead of a probe tip or measuring tip, the contact region 4 of the pin 1 may also be formed in another manner corresponding to the respectively-required applications problem. The other end of the pin 1 is connected via a connecting line 5 to a measuring channel 6 of a measuring instrument or system 7.

In order to achieve an ergonomically-optimised handling of the probe or measuring head according to the invention, the housing 3 is designed in the shape of a substantially cylindrical handle. For reasons of insulation, the probe pin guided axially within the central, internal borehole 8 of the housing 3 is enclosed by a sleeve-like insulating layer 9, which is preferably manufactured from a synthetic material. In order to provide the user of the probe or measuring head with a good visual access to the contact region 4 of the probe pin 1 and the test environment 24 surrounding the contact region 4, the substantially-cylindrically-shaped housing 3 is designed to be conical at its end facing towards the contact region 4 of the probe pin 1.

According to the invention, the contact region 4 of the probe pin 1—for example, the probe tip or measuring tip 4 of the probe pin 1—is illuminated, dependent upon the required intensity of light and the lighting requirements for the probe tip or measuring tip 4 and the surrounding test environment 24, by one or more light sources $10_1$, $10_2$, . . . , $10_n$—for example, light-emitting diodes—, which, in the exemplary embodiment illustrated in FIG. 1, are attached to the probe pin 1 outside the housing 3. The use of several light sources $10_1$, $10_2$, . . . , $10_n$ also allows the provision of a multi-colored lighting. A multi-colored illumination provides the possibility, for example, of displaying the measurement channel 6 of the measuring instrument or system 7 used by the probe or measuring head 1 or the level of the electrical potential measured by the probe or measuring head 1 at the electrical contact, if a color tone of the lighting is assigned to a level of the measured electrical potential.

The two light sources $10_1$ and $10_2$ illustrated in FIG. 1 are each connected via associated connecting lines $11_1$ and $11_2$, which are guided respectively via wireways $12_1$ and $12_2$ within the housing 3 and then as a composite cable together with the connecting line 5, to power-supply terminals $13_1$ and $13_2$ in the measuring instrument or system 7.

Figure 2:
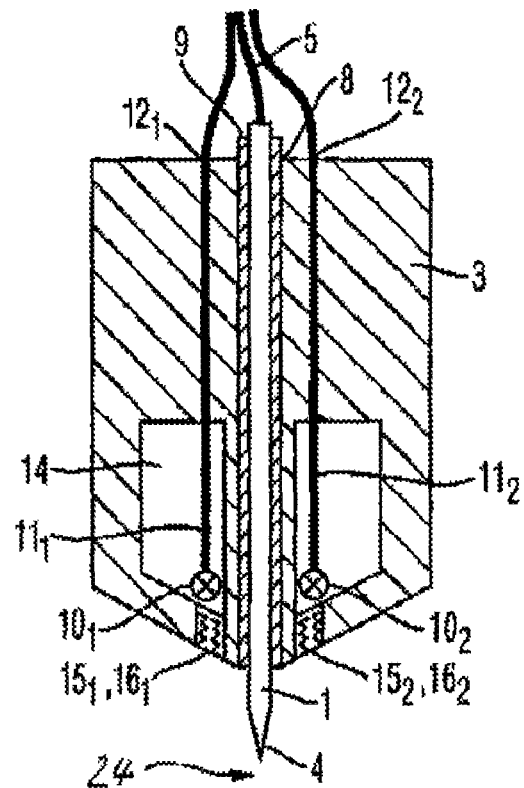
FIG. 2 shows a cross-sectional view of a second embodiment of the probe or measuring head according to the invention with illumination of the contact region of the probe or measuring head and the surrounding test environment.

FIG. 2 shows a second embodiment of the probe or measuring head according to the invention. Features of the second and subsequent embodiments which are identical with reference to the first embodiment of the probe or measuring head according to the invention as shown in FIG. 1 are provided with identical reference numbers. The description of these identical features will therefore not be repeated below.

In the second embodiment of the probe or measuring head according to the invention, the individual light sources $10_1$, $10_2$, . . . , $10_n$ are not positioned outside the housing 3, but in a recess 14 of the housing 3. The light rays generated by the individual light sources $10_1$, $10_2$, . . . , $10_n$ are guided from the recess 14 of the housing 3 to the contact region 4 of the probe pin 1 via recesses $15_1$, $15_2$, $15_n$ allocated respectively to the individual light sources $10_1$, $10_2$, . . . $10_n$ or via a common recess 15 common to all of the individual light sources $10_1$, $10_2$, . . . , $10_n$, each of which is guided from the recess 14 in the direction towards the contact region 4 of the probe pin 1. An adequate illumination of the contact region 4 of the probe pin 1 and of the test environment 24 surrounding the contact region 4 is only guaranteed with the second embodiment, if the distance from the contact region 4 of the probe pin 1 to the housing 3 of the probe or measuring head according to the invention and the distance from the individual light sources $10_1$, $10_2$, . . . , $10_n$ arranged in the recess 14 to the emergence of the light rays from the housing 3 of the probe or measuring head according to the invention is minimised.

The individual recesses $15_1$, $15_2$, . . . , $15_n$ within the housing 3 of the probe or measuring head according to the invention are formed and positioned appropriately in order to achieve a targeted bundling of the light rays from the individual light sources $10_1$, $10_2$, . . . , $10_n$ thereby increasing the light intensity and improving the illumination of the contact region 4 of the probe pin 1 and of the surrounding test environment 24. However, if a diffuse illumination is required in the contact region 4 of the probe pin 1 and in the surrounding test environment 24, the recesses $15_1$, $15_2$, . . . , $15_n$ are filled with a light-scattering layer.

Figure 3:
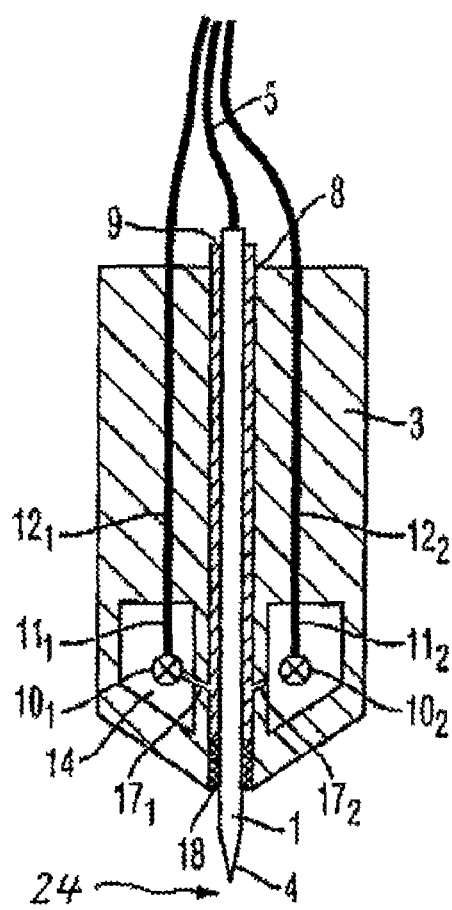
FIG. 3 shows a cross-sectional view of a third embodiment of the probe or measuring head according to the invention with illumination of the contact region of the probe or measuring head and the surrounding test environment.

In the third embodiment of the probe or measuring head according to the invention shown in FIG. 3, the individual light sources $10_1$, $10_2$, . . . , $10_n$ are also positioned in the recess 14 of the housing 3. However, with this third embodiment, the light is not guided via the recesses $15_1$, $15_2$, . . . , $15_n$ and $15_m$ within the housing 3, but via the sleeve-like insulating layer 9, which is made of a light-conducting synthetic material. The light rays generated by the light sources $10_1$, $10_2$, . . . , $10_n$ are guided towards the sleeve-like insulating layer 9, which encloses the axially-guided probe pin 1, respectively via optical waveguides $17_1$, $17_2$, . . . , $17_n$, which are also made of light-conducting synthetic material.

With the third embodiment, a targeted bundling of the light rays of the individual light sources $10_1$, $10_2$, . . . , $10_n$ can also be realized by an appropriate formation of the cross-section of the insulating layer 9. Diffuse illumination in the contact region 4 of the probe pin 1 and in the surrounding test environment 24 is achieved by attaching a light-scattering layer 18 at the emergence of the insulating layer 9 from the internal borehole 8 of the housing 3 in the proximity of the contact region 4 of the probe pin 1.

Figure 4:
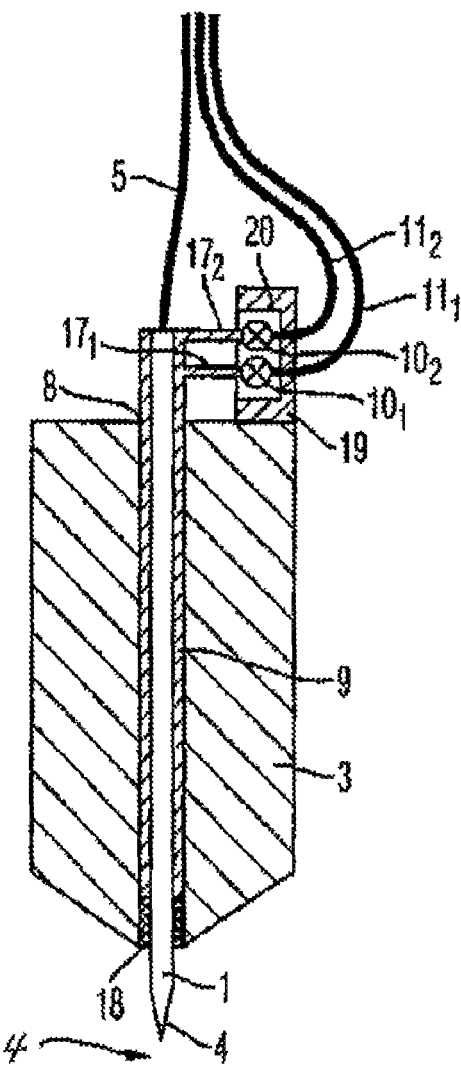
FIG. 4 shows a cross-sectional view of a fourth embodiment of the probe or measuring head according to the invention with illumination of the contact region of the probe or measuring head and the surrounding test environment.

The fourth embodiment of the probe or measuring head according to the invention as shown in FIG. 4 positions the individual light sources $10_1, 10_2, \ldots, 10_n$ in a recess 20 of an additional module 19, which is attached to the housing 3 of the probe or measuring head according to the invention. The light rays from the individual light sources $10_1, 10_2, \ldots, 10_n$ are guided, in a similar manner to the third embodiment illustrated in FIG. 3, via the light-conducting insulating layer 9. As with the third embodiment, the guiding of the light rays generated by the light sources $10_1, 10_2, \ldots, 10_n$ to the insulating layer 9 is also realized via optical waveguides $17_1, 17_2, \ldots, 17_n$, which are again made of light-conducting synthetic material. The bundling of the light rays is achieved in a similar manner to the third embodiment by an appropriate formation of the insulating layer 9. Diffuse illumination is achieved by attaching a light-scattering layer 18 at the emergence of the insulating layer 9 from the internal borehole 8 of the housing 3 in the proximity of the contact region 4 of the probe pin 1.

Figure 5:
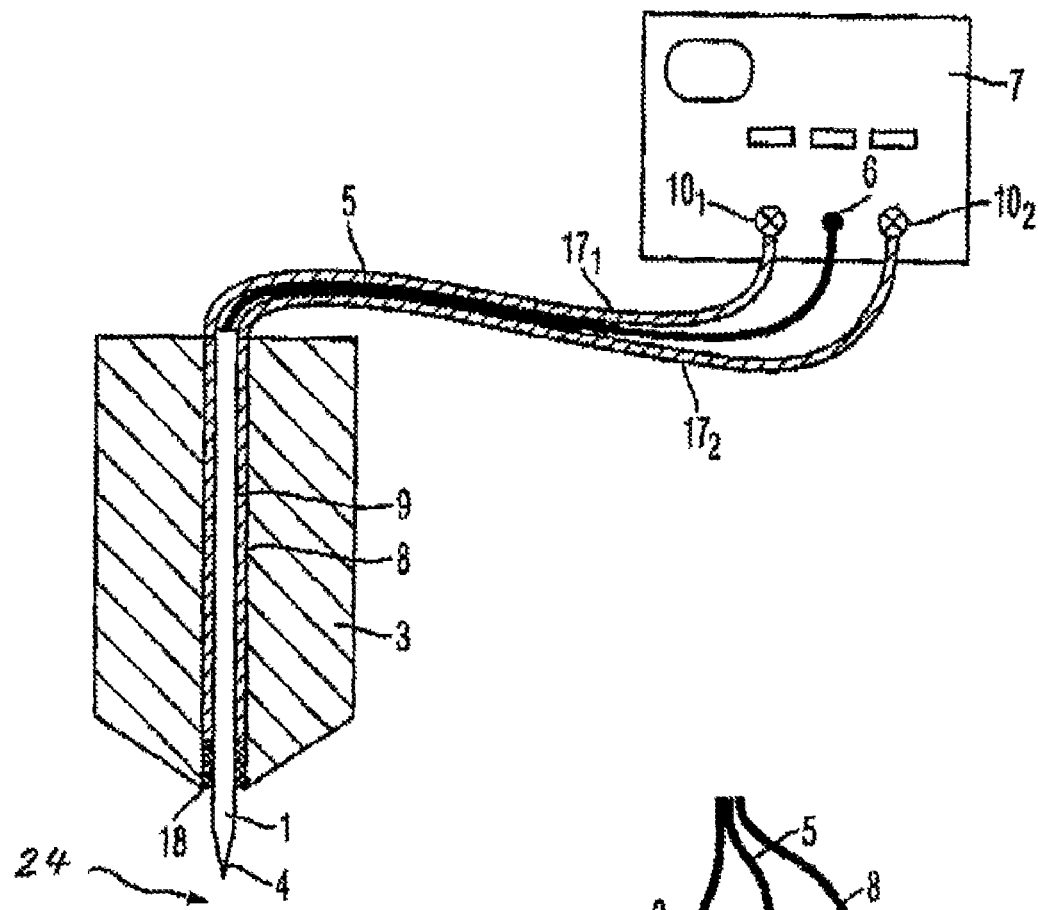
FIG. 5 shows a cross-sectional view of a fifth embodiment of the probe or measuring head according to the invention with illumination of the contact region of the probe or measuring head and the surrounding test environment.

In the fifth embodiment of the probe or measuring head according to the invention as shown in FIG. 5, the individual light sources $10_1, 10_2, \ldots, 10_n$, from which the light rays are guided via the optical waveguides $17_1, 17_2, \ldots, 17_n$, together with the connecting line 5 within the composite cable respectively to the light-conducting insulating layer 9, are positioned in the measuring instrument or system 7. In the fifth embodiment of the invention, the geometric structure of the probe or measuring head, the guiding, bundling and/or scattering of the light rays correspond to those of the fourth embodiment of the probe or measuring head according to the invention as shown in FIG. 4.

Figure 6:
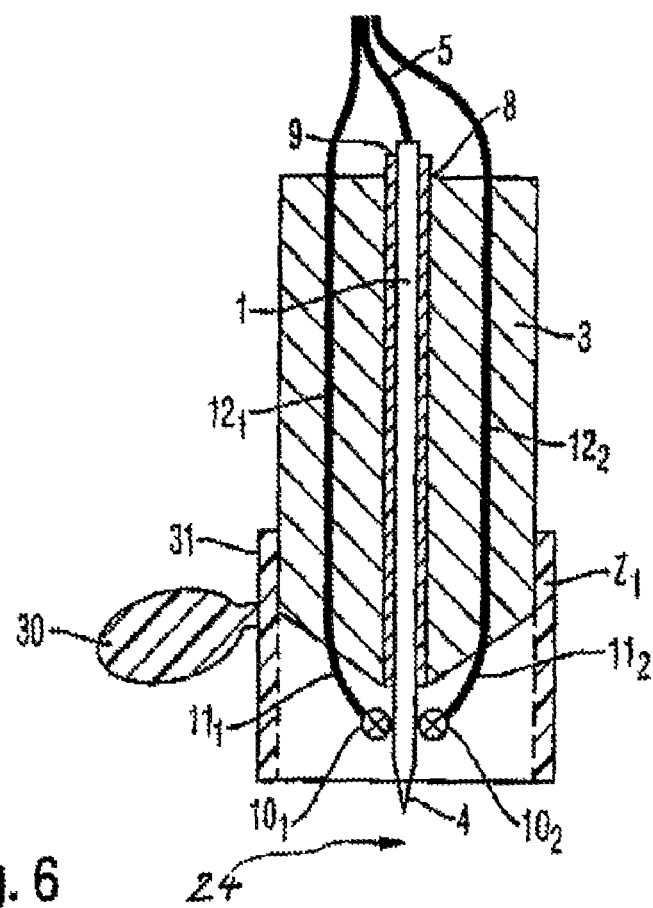
FIG. 6 shows a cross-sectional view of a sixth embodiment of the probe or measuring head according to the invention with illumination of the contact region of the probe or measuring head and the surrounding test environment.

In the sixth embodiment of the probe or measuring head according to the invention as shown in FIG. 6, an optical lens 30, shown by way of example in FIG. 6 formed onto a sleeve 31, is guided in an adjustable manner along the probe pin 1 in order to magnify the contact region 4 of the probe pin 1 and of the surrounding test environment 24. The lighting design in the sixth embodiment of the probe or measuring head according to the invention in FIG. 6 corresponds to that of the first embodiment of the probe or measuring head according to the invention as shown in FIG. 1. The lighting designs presented in FIGS. 2 to 5 can also be selected as an alternative.

Figure 7:
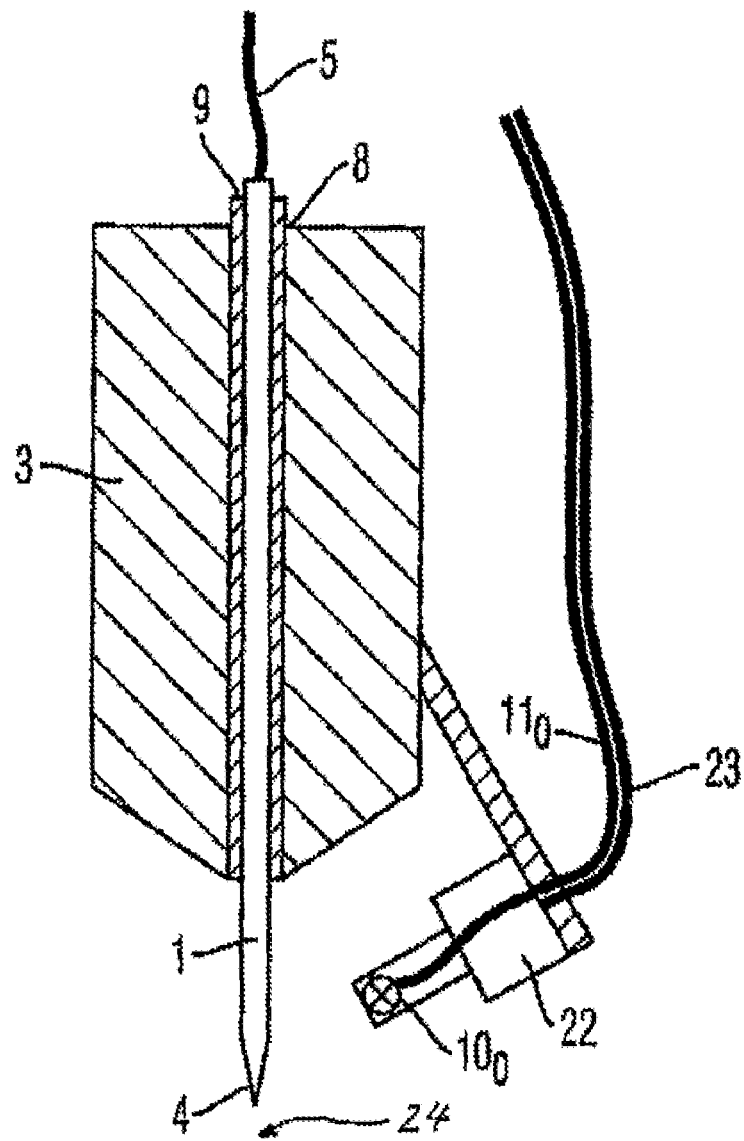
FIG. 7 shows a cross-sectional view of a seventh embodiment of the probe or measuring head according to the invention with illumination of the contact region of the probe or measuring head and the surrounding test environment.

Finally, FIG. 7 shows a seventh embodiment of the probe or measuring head according to the invention, wherein the contact region 4 of the probe pin 1 and the test environment 24 surrounding the contact region 4 is filmed by a camera 22. The camera 22 is miniaturized, for example, using micro-systems technology, and attached mechanically to the housing 3 of the probe or measuring head according to the invention. For further processing, the video data recorded by the camera 22 are transmitted via a connecting line 23 to the measuring instrument or system 7. The illumination of the contact region 4 of the probe pin 1 and of the test environment 24 surrounding the contact region 4 can be realized by a light source $10_0$ attached to the camera 22. Alternatively, the contact region 4 of the pin 1 and the test environment 24 surrounding the contact region 4 can be illuminated with a lighting design corresponding to the first to the fifth embodiments of the probe or measuring head according to the invention, as shown in FIGS. 1 to 5.

The invention is not restricted to the embodiment presented. In particular, different positionings of the light sources and different designs for the guiding, bundling and scattering of light, which are not presented in the embodiments provided here, are also covered by the invention.

The invention claimed is:

1. Probe or measuring head for measuring an electrical signal of an electrical contact comprising an electrically-conductive probe pin projecting from a housing with a contact region at the end of the probe pin, which can be brought into contact with the electrical contact, whereby the contact region of the probe pin and a test environment surrounding the contact region of the probe pin are illuminated by a light source connected to the probe or measuring head wherein the light source is integrated within the probe or measuring head, within a measuring instrument or system, connected to the probe or measuring head or within an additional module connected to the probe or measuring head and the light rays of the light source are guided via optical waveguides towards the probe tip of the probe or measuring head.

2. Probe or measuring head according to claim 1, wherein the contact region of the probe pin and the test environment surrounding the contact region of the probe pin are illuminated by light rays from the light source disposed on the probe pin in the proximity of the contact region.

3. Probe or measuring head according to claim 1, wherein the contact region of the probe pin and the test environment surrounding the contact region of the probe pin are illuminated by light rays from the light source.

4. Probe or measuring head according to claim 3, wherein the light rays are guided towards the contact region of the probe pin and towards the test environment surrounding the contact region of the probe pin through an insulating layer, which surrounds the probe pin with the exception of the contact region.

5. Probe or measuring head according to claim 3 wherein the light rays are guided towards the contact region of the probe pin and towards the measuring environment surrounding the contact region of the probe pin through at least one recess in the housing.

6. Probe or measuring head according to claim 4 wherein a bundling of the light rays is implemented by a targeted formation of the insulating layer.

7. Probe or measuring head according to claim 4, wherein a light-scattering layer is provided in order to achieve a diffuse light beam at the end of the insulating layer facing towards the contact region.

8. Probe or measuring head according to claim 1, wherein a color of a light beam generated by the light source indicates a measurement channel used by the probe or measuring head in the measuring instrument.

9. Probe or measuring head according to claim 1, wherein a color of a light beam generated by the light source corresponds to a level of the electrical potential or to a logical level of the electrical contact to be measured.

10. Probe or measuring head according to claim 1, wherein an optical lens or a camera is guided in an adjustable manner along the probe pin in order to magnify the contact region of the probe pin and of the test environment surrounding the contact region of the probe pin.

11. Probe or measuring head according to claim 5, wherein a bundling of the light rays is implemented by a targeted formation and positioning of the recesses in the housing.

12. Probe or measuring head according to claim 5, wherein a light-scattering layer is provided in order to achieve a diffuse light beam in the recesses.

* * * * *

UNITED STATES PATENT AND TRADEMARK OFFICE
CERTIFICATE OF CORRECTION

| | | |
|---|---|---|
| PATENT NO. | : 7,868,634 B2 | Page 1 of 1 |
| APPLICATION NO. | : 11/913637 | |
| DATED | : January 11, 2011 | |
| INVENTOR(S) | : Hermann Boss et al. | |

It is certified that error appears in the above-identified patent and that said Letters Patent is hereby corrected as shown below:

On the Title Page:

Item (30), "10 2005 023 425" should be -- 10 2005 023 425.9 --.

Signed and Sealed this
Twenty-sixth Day of July, 2011

David J. Kappos
*Director of the United States Patent and Trademark Office*